(12) United States Patent
Jo et al.

(10) Patent No.: US 12,388,048 B2
(45) Date of Patent: Aug. 12, 2025

(54) SEMICONDUCTOR PACKAGE COMPRISING HEAT SPREADER

(71) Applicant: Samsung Electronics Co., Ltd., Suwon-si (KR)

(72) Inventors: Sungeun Jo, Hwaseong-si (KR); Youngdeuk Kim, Hwaseong-si (KR); Jaechoon Kim, Incheon (KR); Taehwan Kim, Hwaseong-si (KR); Kyungsuk Oh, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 17/844,395

(22) Filed: Jun. 20, 2022

(65) Prior Publication Data

US 2023/0063886 A1 Mar. 2, 2023

(30) Foreign Application Priority Data

Aug. 27, 2021 (KR) .................. 10-2021-0113984

(51) Int. Cl.
*H01L 25/065* (2023.01)
*H01L 23/00* (2006.01)
(Continued)

(52) U.S. Cl.
CPC .......... *H01L 25/0657* (2013.01); *H01L 24/08* (2013.01); *H01L 2224/08145* (2013.01);
(Continued)

(58) Field of Classification Search
CPC ....... H01L 25/0657; H01L 2224/08145; H01L 2225/06555; H01L 24/08; H01L 2225/06513; H01L 2225/06517; H01L 2225/06541; H01L 24/25; H01L 2225/06586; H01L 2225/06548; H01L 2225/06582; H01L 2225/06589; H01L 23/3157; H01L 23/36; H01L 2224/16145; H01L 2224/24145; H01L 2224/241; H01L 2224/24; H01L 2224/0812; H01L 2224/08135; H01L 2224/80001; H01L 2224/808; H01L 2224/80895;
(Continued)

(56) References Cited

U.S. PATENT DOCUMENTS 7,518,225 B2   4/2009   Emma et al.
7,990,711 B1   8/2011   Andry et al.
(Continued)

FOREIGN PATENT DOCUMENTS

JP   2008235783 A   10/2008
JP   2012089642 A   5/2012
(Continued)

*Primary Examiner* — Sonya McCall-Shepard
(74) *Attorney, Agent, or Firm* — Myers Bigel, P.A.

(57) ABSTRACT

A semiconductor package includes a first semiconductor chip, a second semiconductor chip stacked on the first semiconductor chip, and a plurality of third semiconductor chips sequentially stacked on the second semiconductor chip, in which a horizontal width of each of the first semiconductor chip and the second semiconductor chip is greater than a horizontal width of each of the plurality of third semiconductor chips, and the first semiconductor chip and the second semiconductor chip are connected to each other through direct contact of a bonding pad.

20 Claims, 10 Drawing Sheets

(51) Int. Cl.
*H01L 23/31* (2006.01)
*H01L 23/36* (2006.01)
*H01L 25/10* (2006.01)
*H01L 25/18* (2023.01)

(52) U.S. Cl.
CPC ............ *H01L 2225/06513* (2013.01); *H01L 2225/06541* (2013.01); *H01L 2225/06582* (2013.01); *H01L 2225/06589* (2013.01)

(58) Field of Classification Search
CPC ......... H01L 25/0652; H01L 2224/0401; H01L 2224/08; H01L 2224/80; H01L 24/05; H01L 2224/13025; H01L 2224/16; H01L 2224/16146; H01L 2224/16227; H01L 2224/73204; H01L 2224/73253; H01L 2224/83; H01L 2224/83193; H01L 24/14
See application file for complete search history.

(56) References Cited

U.S. PATENT DOCUMENTS

| | | | |
|---|---|---|---|
| 8,445,918 | B2 | 5/2013 | Bartley et al. |
| 8,525,342 | B2* | 9/2013 | Chandrasekaran ..... H01L 21/50 257/773 |
| 9,287,240 | B2 | 3/2016 | Li et al. |
| 9,997,434 | B2 | 6/2018 | Kumari et al. |
| 10,515,867 | B2 | 12/2019 | Wu et al. |
| 10,586,785 | B2 | 3/2020 | Gao et al. |
| 10,886,255 | B2 | 1/2021 | Hong et al. |
| 11,721,669 | B2 | 8/2023 | Heo et al. |
| 11,961,823 | B1* | 4/2024 | Jain ..................... H01L 25/0657 |
| 2015/0130078 | A1 | 5/2015 | Hong et al. |
| 2018/0190617 | A1 | 7/2018 | Chew |
| 2019/0157244 | A1 | 5/2019 | Hong |

FOREIGN PATENT DOCUMENTS

| | | |
|---|---|---|
| KR | 101153222 B1 | 6/2012 |
| KR | 20190057559 A | 5/2019 |
| KR | 20200048771 A | 5/2020 |
| KR | 20210035546 A | 4/2021 |

* cited by examiner

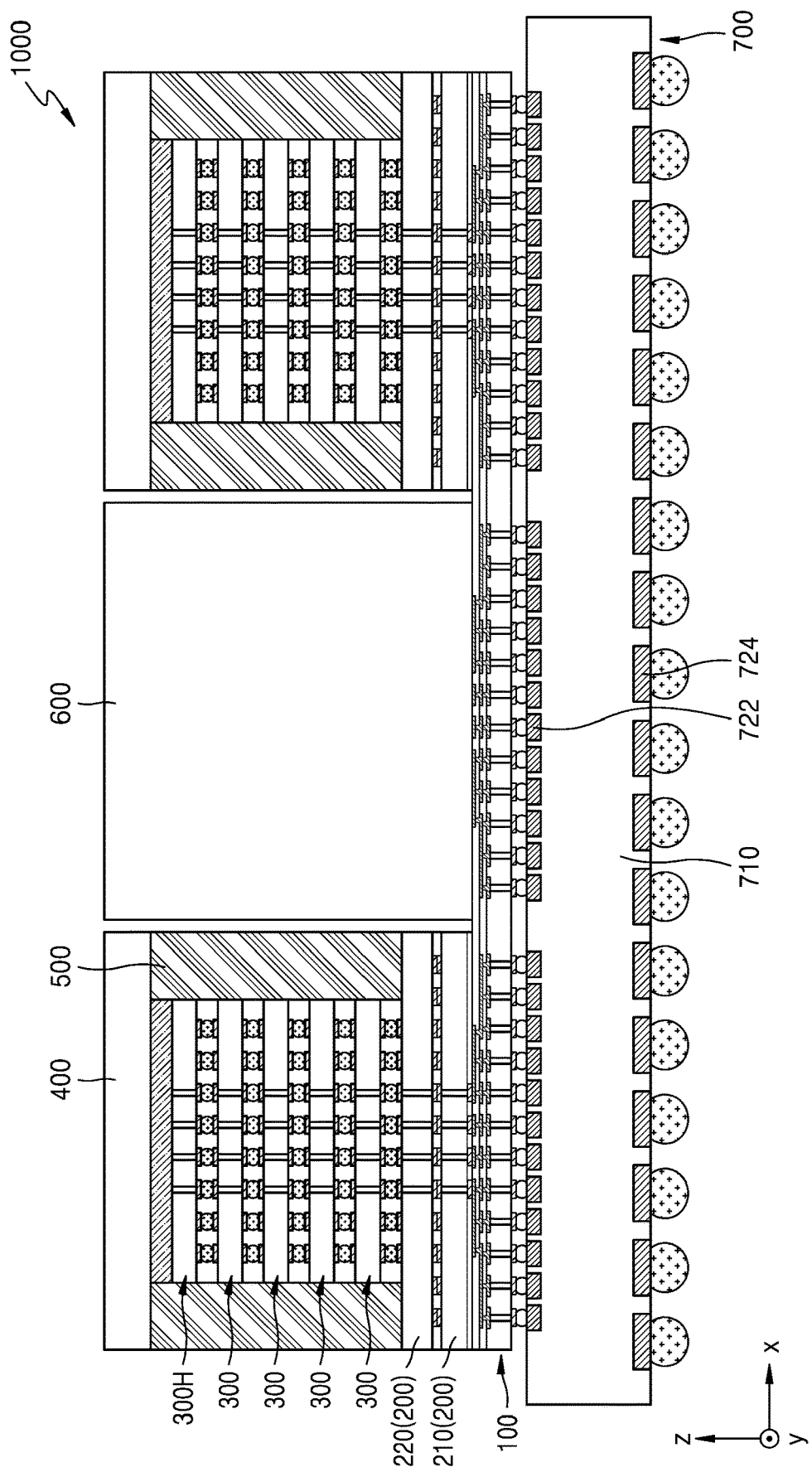

SEMICONDUCTOR PACKAGE COMPRISING HEAT SPREADER

CROSS-REFERENCE TO RELATED APPLICATION

This application is based on and claims priority under 35 U.S.C. § 119 to Korean Patent Application No. 10-2021-0113984, filed on Aug. 27, 2021, in the Korean Intellectual Property Office, the disclosure of which is incorporated by reference herein in its entirety.

BACKGROUND

The inventive concept relates to a semiconductor package, and more particularly, to a semiconductor package including a heat spreader.

As a storage capacity of a semiconductor chip increases, a semiconductor package including the semiconductor chip needs to be thin and light. There is also a trend to include semiconductor chips having various functions in the semiconductor package and to conduct research for rapidly driving the semiconductor chips. With this trend, a need for miniaturization and multi-functions of a semiconductor chip used for an electronic part is increasing. Further, in a package field, active studies have been conducted on a scheme to radiate heat inside the semiconductor package together with miniaturization based on a small semiconductor chip.

SUMMARY

The inventive concept provides a semiconductor package having improved heat dissipation characteristics.

According to an aspect of the inventive concept, there is provided a semiconductor package including a first semiconductor chip, a second semiconductor chip stacked on the first semiconductor chip, and a plurality of third semiconductor chips sequentially stacked on the second semiconductor chip, in which a horizontal width of each of the first semiconductor chip and the second semiconductor chip is greater than a horizontal width of each of the plurality of third semiconductor chips, and the first semiconductor chip and the second semiconductor chip are connected to each other through direct contact of a bonding pad.

According to another aspect of the inventive concept, there is provided a semiconductor package including an interposer, a first semiconductor chip stacked on the interposer, a dummy chip stacked on the first semiconductor chip, a second semiconductor chip stacked on the dummy chip, a plurality of third semiconductor chips sequentially stacked on the second semiconductor chip, a heat dissipation structure stacked on the plurality of third semiconductor chips, and a molding layer surrounding the plurality of third semiconductor chips and at least a portion of the heat dissipation structure, in which the first through third semiconductor chips and the dummy chip include through electrodes passing therethrough, a horizontal width of each of the first semiconductor chip, the dummy chip, and the second semiconductor chip is greater than a horizontal width of each of the plurality of third semiconductor chips, side surfaces of the first semiconductor chip, the dummy chip, and the second semiconductor chip are substantially coplanar with each other, the first semiconductor chip and the dummy chip are connected to each other through direct contact of a bonding pad, and the dummy chip and the second semiconductor chip are connected to each other through direct contact of a bonding pad.

According to another aspect of the inventive concept, there is provided a semiconductor package including an interposer, a first semiconductor chip stacked on the interposer, a second semiconductor chip stacked on the first semiconductor chip, a plurality of third semiconductor chips sequentially stacked on the second semiconductor chips, a fourth semiconductor chip disposed between the second semiconductor chip and the plurality of third semiconductor chips, a heat dissipation structure stacked on the plurality of third semiconductor chips, and a molding layer surrounding the plurality of third semiconductor chips and at least a portion of the heat dissipation structure, in which each of the first through fourth semiconductor chips includes through electrodes passing therethrough, a horizontal width of each of the first semiconductor chip, the second semiconductor chip, and the fourth semiconductor chip is greater than a horizontal width of each of the plurality of third semiconductor chips, side surfaces of the first semiconductor chip, the second semiconductor chip, and the fourth semiconductor chip are substantially coplanar with each other, the first semiconductor chip and the second semiconductor chip are connected to each other through direct contact of a bonding pad, and the second semiconductor chip and the fourth semiconductor chip are connected to each other through direct contact of a bonding pad.

BRIEF DESCRIPTION OF THE DRAWINGS

Embodiments of the inventive concept will be more clearly understood from the following detailed description taken in conjunction with the accompanying drawings in which:

FIG. 4 is a cross-sectional view of a semiconductor package according to an embodiment of the inventive concept.

DETAILED DESCRIPTION

Figure 1A:
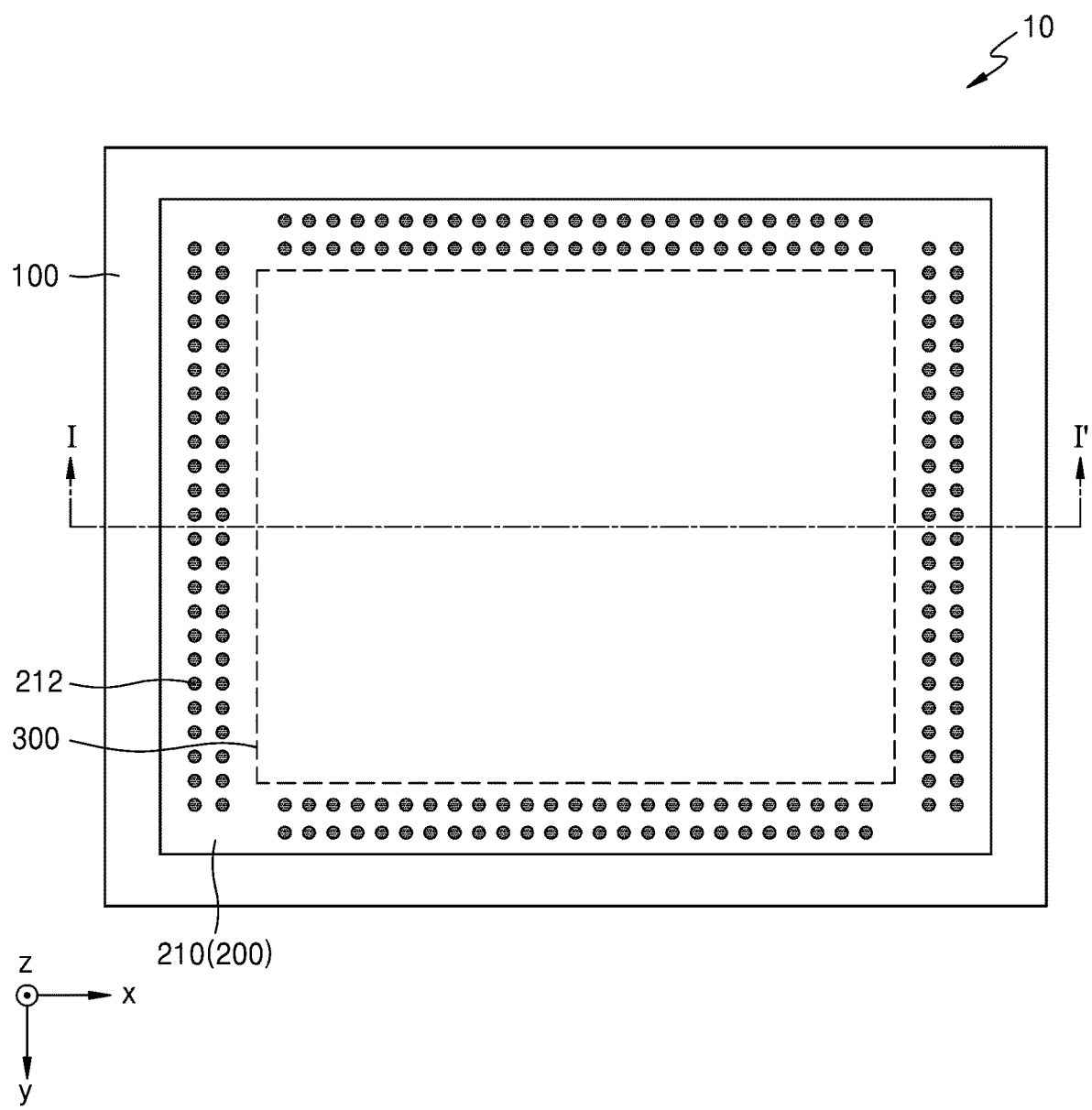
FIGS. 1A through 1C are a plan view and cross-sectional views of a semiconductor package, according to an embodiment of the inventive concept.

Hereinafter, various embodiments of the inventive concept will be described in detail with reference to the accompanying drawings. Like components in the drawings will be referred to as like reference numerals, and may not be repeatedly described in the interest of brevity.

Figure 1B:
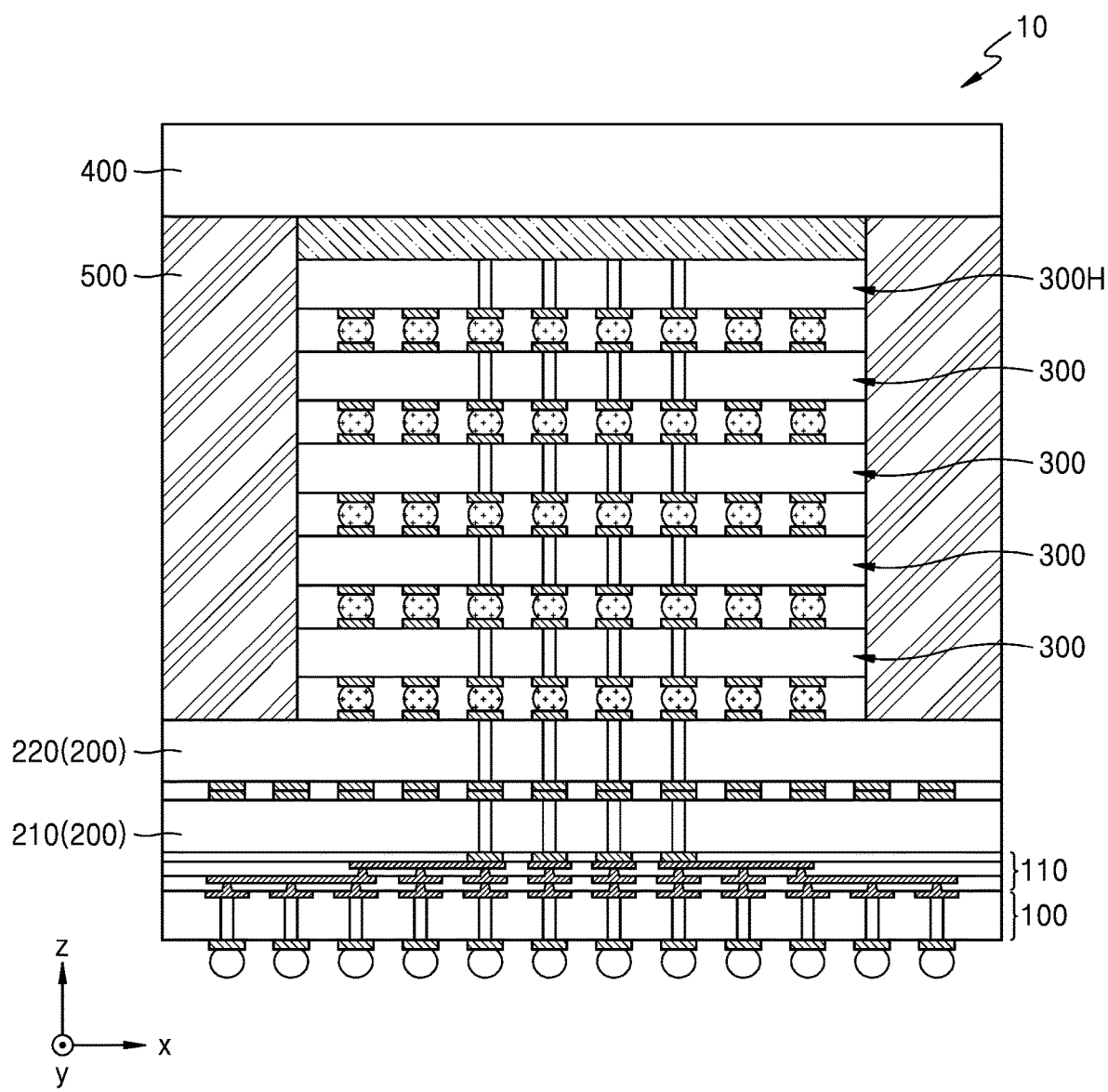
Figure 1C:
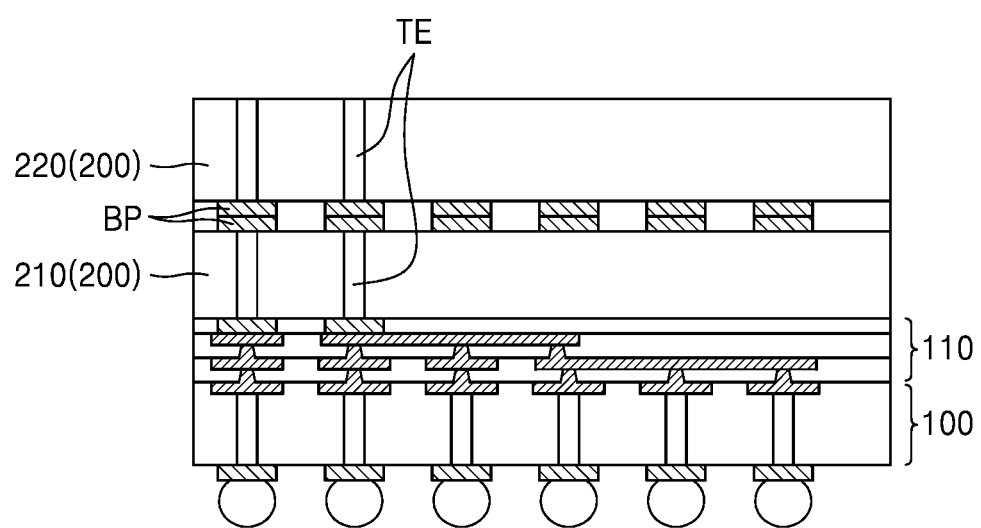

FIG. 1A is a plan view of a semiconductor package 10 according to an embodiment of the inventive concept, and FIGS. 1B and 1C are cross-sectional views cut along a portion I-I' of the semiconductor package 10 of FIG. 1A.

Referring to FIGS. 1A through 1C, the semiconductor package 10 according to the current embodiment of the inventive concept may include an interposer 100, a first semiconductor chip 210 disposed on the interposer 100, a second semiconductor chip 220 disposed on the first semiconductor chip 210, a plurality of third semiconductor chips 300 disposed on the second semiconductor chip 220, and a heat dissipation structure 400 disposed on the plurality of third semiconductor chips 300.

While is it shown in FIGS. 1B and 1C that one semiconductor package 10 includes one first semiconductor chip 210, one second semiconductor chip 220, and five third semiconductor chips 300, the inventive concept is not limited thereto. For example, the semiconductor package 10 may include a plurality of first semiconductor chips 210 and/or a plurality of second semiconductor chips 220. In some embodiments of the inventive concept, one semiconductor package 10 may include four or less or six or more third semiconductor chips 300. For example, one semiconductor package 10 may include 10, 14, or 18 the third semiconductor chips 300. The plurality of third semiconductor chips 300 may be sequentially disposed on the second semiconductor chip 220 in a vertical direction.

The semiconductor package 10 according to the inventive concept may have a wide horizontal width and thick semiconductor chips 200 under the plurality of third semiconductor chips 300, thereby improving the heat dissipation performance of the semiconductor package 10.

In particular, generally, the heat dissipation structure 400 is attached to a top surface of the plurality of semiconductor chips 300, whereas the heat dissipation structure 400 is not attached to a bottom surface of the semiconductor package 10, such that heat generated from the bottom surface of the semiconductor package 10 may not be easily dissipated.

The semiconductor package 10 according to the inventive concept may include a heat spreader for performing heat dissipation on the bottom surface of the semiconductor package 10. Therefore, the heat generated on the bottom surface of the semiconductor package 10 may be easily discharged to the outside of the semiconductor package 10. In addition, the thickness (a Z-direction) of the semiconductor package 10 may not be greatly increased by including the semiconductor chips 200 as the heat spreader.

In some embodiments, the interposer 100 may be a redistribution layer (RDL) interposer. An interposer redistribution layer 110 may be stacked on the interposer 100. The interposer redistribution layer 110 may include at least one redistribution insulation layer and a plurality of redistribution patterns. The plurality of redistribution patterns may include a plurality of redistribution line patterns and a plurality of redistribution vias.

For example, the interposer redistribution layer 110 may include a plurality of stacked redistribution insulation layers. The redistribution insulation layer may be formed of an insulating material, for example, photo-imageable dielectric (PID) resin, and may further include a photosensitive polyimide and/or an inorganic filler.

A plurality of redistribution patterns including a plurality of redistribution line patterns and a plurality of redistribution vias may include, but are not limited to, metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc., or an alloy thereof.

The plurality of redistribution line patterns and the plurality of redistribution vias may be manufactured through an exposure process and a developing process with respect to a photosensitive insulation material. In some embodiments, the plurality of redistribution patterns may be formed by stacking metal or an alloy of metal on a seed layer including titanium, titanium nitride and/or titanium tungsten.

The plurality of redistribution line patterns may be disposed on at least one of the top surface or the bottom surface of the redistribution insulation layer. The plurality of redistribution vias may be connected in contact with a portion of the plurality of redistribution line patterns through at least one redistribution insulation layer. In some embodiments of the inventive concept, at least some of the plurality of redistribution line patterns may be formed with some of the plurality of redistribution vias to form one body. For example, the redistribution line pattern and the redistribution via contacting the top surface of the redistribution line pattern may form one body.

A plurality of redistribution patterns including a plurality of redistribution line patterns and a plurality of redistribution vias may be formed by a plating method. For example, the plurality of redistribution patterns may be formed by a plating method such as immersion plating, electroless plating, or electroplating.

In some embodiments of the inventive concept, the plurality of redistribution vias may have a tapered shape extending with a horizontal width decreasing from bottom to top. That is, the plurality of redistribution vias may have a horizontal width increasing apart or away from the first semiconductor chip 210.

Some of the plurality of redistribution line patterns, which are disposed on the top surface of the interposer redistribution layer 110, may be referred to as a redistribution top pad, and some of the plurality of redistribution line patterns, which are disposed on the bottom surface of the interposer 100, may be referred to as an external connection pad. A first front connection pad of the first semiconductor chip 210 may be connected to the redistribution top pad, and a package connection terminal may be attached to the external connection pad. The package connection terminal may function as an external connection terminal of the semiconductor package 10. The package connection terminal may electrically connect the semiconductor package 10 to the outside of the semiconductor package 10. In some embodiments of the inventive concept, the package connection terminal may be a conductive bump and/or a solder ball, etc., including a conductive material, for example, at least any one of Sn, Ag, Cu, and Al.

As shown in FIG. 1B, the external connection pad may be disposed on a portion corresponding to the bottom surface of the first semiconductor chip 210 or the interposer 100 and on a portion extending outwardly from the bottom surface in a first direction (an x direction) and a second direction (a y direction). As a result, the interposer 100 may rearrange the first front connection pad of the first semiconductor chip 210 as an external connection pad in a wider portion than the bottom surface of the first semiconductor chip 210.

According to an embodiment of the inventive concept, the interposer 100 may be replaced with a semiconductor substrate. The semiconductor substrate may include silicon (Si). However, the semiconductor substrate may include a semiconductor element such as germanium (Ge) or a compound semiconductor such as silicon carbide (SiC), gallium arsenide (GaAs), indium arsenide (InAs), and indium phosphide (InP), without being limited thereto.

In some embodiments, the first semiconductor chip 210 may not include a memory cell. The first semiconductor chip 210 may include a serial-parallel conversion circuit, a design for test (DFT), a joint test action group (JTAG), a test logic circuit such as memory built-in self-test (MBIST), and a signal interface circuit such as a PHY. The second semiconductor chip 220 and the plurality of third semiconductor chips 300 may include a memory cell. For example, the first semiconductor chip 210 may be a buffer chip for controlling the second semiconductor chip 220 and the plurality of third semiconductor chips 300.

The second semiconductor chip 220 and the plurality of third semiconductor chips 300 may be a volatile memory such as dynamic random access memory (DRAM), static random access memory (SRAM), etc., or a nonvolatile memory such as phase-change random access memory (PRAM), magneto-resistive random access memory (MRAM), ferroelectric random access memory (MRAM), or resistive random access memory (RRAM).

In some embodiments, the first semiconductor chip 210 may be a buffer chip for controlling high bandwidth memory (HBM)-DRAM, and the second semiconductor chip 220 and the plurality of third semiconductor chips 300 may be a memory cell chip having a cell of the HBM-DRAM controlled by the first semiconductor chip 210. The first semiconductor chip 210 may be referred to as a buffer chip or a master chip, and the second semiconductor chip 220 and the plurality of third semiconductor chips 300 may be referred to as slave chips or memory cell chips. The first semiconductor chip 210 and the second semiconductor chip 220 and the plurality of third semiconductor chips 300 stacked on the first semiconductor chip 210 may be collectively referred to as HBM DRAM devices.

The first semiconductor chip 210 may include a first substrate, a plurality of first front connection pads, a plurality of first rear connection pads, and a plurality of first through electrodes. The second semiconductor chip 220 may include a second substrate, a plurality of second front connection pads, a plurality of second rear connection pads, and a plurality of second through electrodes. The third semiconductor chips 300 may include a third substrate, a plurality of third front connection pads, a plurality of third rear connection pads, and a plurality of third through electrodes.

The first through third substrates may include Si. Alternatively, the first to third substrates may include a semiconductor element such as Ge, or a compound semiconductor such as SiC, GaAs, InAs, and InP. The first substrate, the second substrate, and the third substrate may have an active surface and an inactive surface opposite to the active surface.

The first through third substrates may include various kinds of individual devices on the active surface. The plurality of individual devices may include various microelectronics devices, for example, a metal-oxide-semiconductor field effect transistor (MOSFET) such as a complementary metal-insulator-semiconductor or complementary metal-oxide-semiconductor (CMOS) transistor, an image sensor such as a system large scale integration (LSI), a CMOS imaging sensor (CIS), etc., a micro-electro-mechanical system (MEMS), an active device, and/or a passive device, etc.

The semiconductor substrate may be a printed circuit board (PCB) including a plurality of package substrate pads. However, the semiconductor substrate may include various kinds of substrates without being limited to a structure and a material of a PCB.

The first to third semiconductor chips 210, 220, and 300 may include first to third semiconductor devices formed by the plurality of individual devices.

The first to third semiconductor devices may be formed on the active surface of the first to third substrates, and the first to third front connection pads and the plurality of first to third rear connection pads may be disposed on the active surface and the inactive surface of the first to third substrates, respectively.

The plurality of first through electrodes may vertically penetrate at least a portion of the first substrate to electrically connect the plurality of first front connection pads to the plurality of first rear connection pads.

The plurality of second through electrodes may vertically penetrate at least a portion of the second substrate to electrically connect the plurality of second front connection pads to the plurality of second rear connection pads. The plurality of second through electrodes may be electrically connected to the plurality of first through electrodes.

The plurality of third through electrodes may vertically penetrate at least a portion of the third substrate to electrically connect the plurality of third front connection pads to the plurality of third rear connection pads. The plurality of third through electrodes may be electrically connected to the plurality of second through electrodes.

The semiconductor chips 200 may have through electrodes. The through electrodes may be through silicon vias (TSVs) having a structure that penetrates silicon of the semiconductor chips 200. The TSV may connect the semiconductor chips 200 to the electrodes inside the semiconductor chips 200 through fine holes of the semiconductor chips 200 to transmit electrical signals.

The plurality of redistribution top pads of the plurality of redistribution line patterns may be connected on the plurality of first front connection pads of the first semiconductor chip 210.

A plurality of chip connection terminals may be attached to a plurality of second front connection pads of the second semiconductor chip 220. The plurality of chip connection terminals may be disposed between the plurality of first rear connection pads of the first semiconductor chip 210 and the plurality of second front connection pads of the second semiconductor chip 220, and between the second rear connection pads to electrically connect the first semiconductor chip 210 to the second semiconductor chip 220.

A plurality of chip connection terminals may be attached to the plurality of third front connection pads of each of the plurality of third semiconductor chips 300. The plurality of chip connection terminals may be disposed between the plurality of second rear connection pads of the second semiconductor chip 220 and a plurality of third front connection pads of a lowermost third semiconductor chip 300 among the plurality of third semiconductor chips 300, and between a plurality of third front connection pads of the other third semiconductor chips 300 among the plurality of third semiconductor chips 300 and a plurality of third rear connection pads of other third semiconductor chips 300 under the other third semiconductor chips 300, thereby electrically connecting the second semiconductor chip 220 to the plurality of third semiconductor chips 300.

As a result, the first semiconductor chip 210 and the plurality of third semiconductor chips 300 may be electrically connected.

In some embodiments, an uppermost third semiconductor chip 300H, which is located farthest from the first semiconductor chip 210, among the plurality of third semiconductor chips 300, may not include a third rear connection pad and third through electrodes.

The chip connection terminal may be attached to the semiconductor chip 200 after under bump metallization (UBM) formation on the semiconductor chip 200 by vacuum plating or electroplating. A UBM layer may facilitate adhesion between the semiconductor chip 200 and a conductive bump.

An insulating adhesive layer may be disposed between the first semiconductor chip 210 and the second semiconductor chip 220 and/or between the second semiconductor chip 220 and each of the plurality of third semiconductor chips 300.

The insulating adhesive layer may be attached to the bottom surface of each of the plurality of third semiconductor chips 300 to attach each of the plurality of third semiconductor chips 300 to a lower structure, for example, the second semiconductor chip 220 or other third semiconductor chips 300 positioned in a lower side among the plurality of third semiconductor chips 300. The insulating adhesive layer may include a non-conductive film (NCF), a non-conductive paste (NCP), an insulating polymer, or an epoxy resin. The insulating adhesive layer may surround the chip connection terminal and fill a gap between the second semiconductor chip 220 and each of the plurality of third semiconductor chips 300. In addition, the insulating adhesive layer may fill a gap between the first semiconductor chip 210 and the second semiconductor chip 220.

The thickness of each of the first semiconductor chip 210 and the second semiconductor chip 220 may be greater than the thickness of each of the plurality of third semiconductor chips 300. The first semiconductor chip 210 and the second semiconductor chip 220 may be heat spreaders that dissipate heat of the semiconductor package 10. Thus, when the first semiconductor chip 210 and the second semiconductor chip 220 are thicker than each of the plurality of third semiconductor chips 300, the heat dissipation performance of the semiconductor package 10 may be improved.

For example, a ratio of the thickness of each of the first semiconductor chip 210 and the second semiconductor chip 220 to the thickness of each of the plurality of third semiconductor chips 300 may be greater than or equal to about 130%. For example, a ratio of the thickness of each of the first semiconductor chip 210 and the second semiconductor chip 220 to the thickness of each of the plurality of third semiconductor chips 300 may be about 130% to about 195%. For example, when the thickness of each of the third semiconductor chips 300 is about 50 μm, the thickness of the first semiconductor chip 210 and the thickness of the second semiconductor chip 220 may be about 65 μm to about 95 μm.

In some embodiments, a ratio of the thickness of each of the first semiconductor chip 210 and the second semiconductor chip 220 to the thickness of each of the plurality of third semiconductor chips 300 may be about 150% to about 170%. When a ratio of the thickness of each of the first semiconductor chip 210 and the second semiconductor chip 220 to the thickness of each of the plurality of third semiconductor chips 300 is 150% to 170%, a ratio of an increase of the heat dissipation performance of the semiconductor package 10 to an increase of the height of the semiconductor package 10 may be greatly improved. For example, when the thickness of each of the third semiconductor chips 300 is about 50 μm, the thickness of the first semiconductor chip 210 and the thickness of the second semiconductor chip 220 may each be about 65 μm to about 95 μm or about 75 μm to about 85 μm.

According to an embodiment of the inventive concept, the thickness of the first semiconductor chip 210 and the thickness of the second semiconductor chip 220 may be the same as each other. When the thickness of the first semiconductor chip 210 and the thickness of the second semiconductor chip 220 are the same as each other, the convenience of a process may be increased.

According to an embodiment of the inventive concept, a horizontal width of each of the first semiconductor chip 210 and the second semiconductor chip 220 may be greater than a horizontal width of each of the plurality of third semiconductor chips 300. As described above, the first semiconductor chip 210 and the second semiconductor chip 220 act as heat spreaders that dissipate the heat of the semiconductor package 10, and as a result, the heat dissipation performance of the semiconductor package 10 may be improved when the horizontal width of each of the first semiconductor chip 210 and the second semiconductor chip 220 are larger than the horizontal width of each of the plurality of third semiconductor chips 300.

Thus, a portion of each of the first semiconductor chip 210 and the second semiconductor chip 220 may protrude or extend further horizontally from an outer or side surface of the plurality of third semiconductor chips 300. For example, the plurality of third semiconductor chips 300 may overlap or be aligned with both the first semiconductor chip 210 and the second semiconductor chip 220 in a vertical direction.

For example, a ratio of the horizontal width of each of the first semiconductor chip 210 and the second semiconductor chip 220 to the horizontal width of each of the plurality of third semiconductor chips 300 may be greater than or equal to about 110%. For example, the ratio of the horizontal width of each of the first semiconductor chip 210 and the second semiconductor chip 220 to the horizontal width of each of the plurality of third semiconductor chips 300 may be about 110% to about 140%. For example, the ratio of the horizontal width of each of the first semiconductor chip 210 and the second semiconductor chip 220 to the horizontal width of each of the plurality of third semiconductor chips 300 may be about 115% to about 130%. When the ratio of the width of each of the first semiconductor chip 210 and the second semiconductor chip 220 to the width of each of the plurality of third semiconductor chips 300 is 115% to 130%, the ratio of the increase of the heat dissipation performance of the semiconductor package 10 to the increase of the height of the semiconductor package 10 may be greatly improved.

In some embodiments, the horizontal width and area of the first semiconductor chip 210 may be the same as the horizontal width and area of the second semiconductor chip 220. For example, a side surface of the first semiconductor chip 210 may be located coplanar or substantially coplanar with a side surface of the second semiconductor chip 220. When the first semiconductor chip 210 and the second semiconductor chip 220 have the same horizontal width and area, the convenience of a process may be increased.

The first semiconductor chip 210 and the second semiconductor chip 220, and the second semiconductor chip 220 and each of lowermost third semiconductor chips 300 among the plurality of third semiconductor chips 300 may be connected to one another through direct bonding through Cu (Cu-to-Cu direct bonding), oxide bonding, and/or direct contact of a bonding pad. The respective semiconductor chips 200 may include through electrodes, and thus may be connected to one another without a conductive bump. For example, a distance between the first semiconductor chip 210 and the second semiconductor chip 220, and a distance between the second semiconductor chip 220 and each of the plurality of third semiconductor chips 300 may be about 1 μm to about 5 μm. For example, the distance between the first semiconductor chip 210 and the second semiconductor chip 220, and the distance between the second semiconductor chip 220 and each of the lowermost third semiconductor chips 300 among the plurality of third semiconductor chips 300 may be about 2 μm to about 3 μm.

The distance between the semiconductor chips 200 may mean a distance from the inactive surface of the substrate of the semiconductor chip 200 disposed below to the active surface of the substrate of the semiconductor chip 200 disposed above.

The direct connection may reduce the distance between the semiconductor chips 200, thereby reducing the height of the semiconductor package 10 and improving the heat dissipation performance of the semiconductor package 10. That is, the substantial thickness of the heat spreader may be increased by making the heat spreaders be substantially adjacent to each other.

The plurality of third semiconductor chips 300 may be connected to each other by Cu-to-Cu direct bonding, oxide bonding and/or direct contact of a bonding pad, or by including a conductive bump. For example, a distance between each of the plurality of third semiconductor chips 300 may be about 5 μm to about 15 μm.

When the semiconductor chips 200 are connected using a conductive bump, the distance between the semiconductor chips 200 may be greater than when the semiconductor chips 200 are connected to each other through Cu-to-Cu direct bonding, oxide bonding, and/or direct contact of a bonding pad.

As shown in FIG. 1A, when the horizontal width of the first semiconductor chip 210 or the second semiconductor chip 220 is greater than the horizontal width of each of the plurality of third semiconductor chips 300, the horizontal width and the horizontal area of the first semiconductor chip 210 or the second semiconductor chip 220 may be greater than a horizontal width and a horizontal area of a footprint formed by the plurality of third semiconductor chips 300. That is, at least some chip connection terminals of the first semiconductor chip 210 or the second semiconductor chip 220 may be disposed outside an overlapping region of the first semiconductor chip 210 or the second semiconductor chip 220 with the plurality of third semiconductor chips 300. Thus, an area in which heat may be dissipated inside the semiconductor package 10 may be increased.

It is shown in the drawing that as an example, some of chip connection terminals 212 of the first semiconductor chip 210 are disposed outside an overlapping region of the first semiconductor chip 210 with the plurality of third semiconductor chips 300 (e.g., outside a region that the first semiconductor chip 210 overlaps or vertically aligns with the plurality of third semiconductor chips 300).

The heat dissipation structure 400 may be disposed on the plurality of third semiconductor chips 300. A thickness of the heat dissipation structure 400 may be greater than the thickness of each of the first semiconductor chip 210 and the second semiconductor chip 220. When the heat dissipation structure 400 is thick, the heat of the semiconductor package 10 may be more easily dissipated.

The heat dissipation structure 400 may include a semiconductor material. For example, the heat dissipation structure 400 may include Si. Alternatively, the heat dissipation structure 400 may include a semiconductor element such as Ge, or a compound semiconductor such as SiC, GaAs, InAs, and InP. For example, the heat dissipation structure 400 may include the same material as the first substrate.

The heat dissipation structure 400 may include a material having a higher thermal conductivity than the semiconductor chips 200. For example, the heat dissipation structure 400 may include Cu. For example, the heat dissipation structure 400 may include electroplating Cu. Electroplating may include forming metal coating on the heat dissipation structure 400 through electrolysis.

The heat dissipation structure 400 may include a plurality of layers. The plurality of layers may include the same material, or may include different materials. The material of the heat dissipation structure 400 is not limited to Cu. For example, the heat dissipation structure 400 may include a metal having good thermal conductivity. For example, the heat dissipation structure 400 may include metals such as nickel (Ni), gold (Au), silver (Ag), Al, W, Ti, Ta, In, Mo, Mn, Co, Sn, Mg, Re, Be, Ga, Ru, etc., or an alloy thereof.

According to an embodiment of the inventive concept, the plurality of third semiconductor chips 300 and the heat dissipation structure 400 may be adhered to each other by a thermal interface material (TIM).

The semiconductor package 10 may further include a molding layer 500 surrounding the plurality of third semiconductor chips 300 on the first semiconductor chip 210 and the second semiconductor chip 220. The molding layer 500 may include, for example, an epoxy mold compound (EMC). In some embodiments, the molding layer 500 may cover a side surface of the plurality of third semiconductor chips 300, a side surface of an insulating adhesive layer, and a top surface of the uppermost third semiconductor chip 300H among the plurality of third semiconductor chips 300.

In some embodiments, the molding layer 500 may cover the side surface of the plurality of third semiconductor chips 300 without covering a side surface of the heat dissipation structure 400. For example, a bottom surface of the heat dissipation structure 400 may be coplanar or substantially coplanar with a top surface of the molding layer 500.

According to an embodiment of the inventive concept, a side surface of the molding layer 500 may be coplanar or substantially coplanar with the side surface of each of the first semiconductor chip 210 and the second semiconductor chip 220. The side surface of the molding layer 500 may be coplanar or substantially coplanar with a side surface of the heat dissipation structure 400.

In some embodiments, when the first semiconductor chip 210 and the second semiconductor chip 220 do not entirely cover a top surface of the interposer 100, the molding layer 500 may further cover a part of the top surface of the interposer 100 not covered by the first semiconductor chip 210 and the second semiconductor chip 220.

In the semiconductor package 10 according to the inventive concept, heat generated in the first semiconductor chip 210 and the second semiconductor chip 220 may be dissipated outside of the semiconductor package 10 through the first semiconductor chip 210 and the second semiconductor chip 220. The reliability of the operation of the semiconductor package 10 may be secured by dissipating internal heat of the semiconductor package 10.

Also, the semiconductor package 10 according to the inventive concept may have a fan-out package structure in which a horizontal width and a horizontal area of the interposer 100 are at least greater than a horizontal width and a horizontal area of a footprint of the semiconductor chips 200. In the fan-out package structure, at least some package connection terminals may be disposed outside an overlapping region with the semiconductor chips 200. As described above, when the interposer 100 repositions at least some first chip connection terminals of the first semiconductor chip 210 as external connection terminals outside an overlapping region with the interposer 100 with the first semiconductor chip 210, the semiconductor package 10 may have the fan-out package structure. In another embodiment, the semiconductor package 10 may have a fan-in package structure in which the horizontal width and the horizontal area of the interposer 100 are less than or equal to the horizontal width and the horizontal area of a footprint of the semiconductor chips 200.

FIG. 1C shows a state in which the first semiconductor chip 210 and the second semiconductor chip 220 are connected to each other through direct contact of a bonding pad BP. In some embodiments, there is a first bonding pad BP on the first semiconductor chip 210 and a second bonding pad BP on the second semiconductor chip 220 and the first semiconductor chip 210 and the second semiconductor chip 220 are connected to each other through direct contact of first and second bonding pads.

Referring to FIG. 1C, the first and second semiconductor chips 210 and 220 may include respective through electrodes TE. The through electrodes of each of the first and second semiconductor chips 210 and 220 may be electrically connected to another semiconductor chip 200 through the bonding pad.

Although it is illustrated in the drawing as an example that each of the first and second semiconductor chips 210 and 220 includes two through electrodes, this illustration is an example and the number of through electrodes included in one semiconductor chip 200 is not limited thereto.

At least some through electrodes of the first semiconductor chip 210 and/or the second semiconductor chip 220 may be disposed outside the overlapping region of the first semiconductor chip 210 and/or the second semiconductor chip 220 with the plurality of third semiconductor chips 300.

Figure 2:
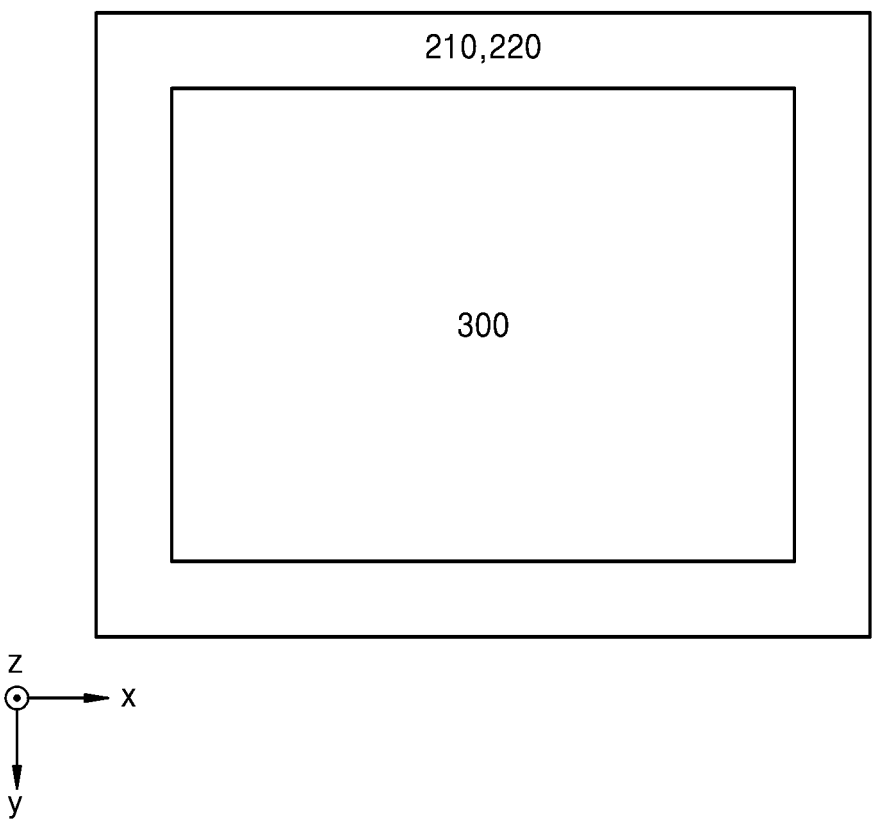
FIG. 2 is a plan layout showing a planar arrangement of some components of a semiconductor package, according to an embodiment of the inventive concept.

FIG. 2 is a plan layout showing a planar arrangement of some components of the semiconductor package 10, according to an embodiment of the inventive concept. In FIG. 2, the same reference numerals as in FIGS. 1A through 1C indicate substantially the same members, and a description made with reference to FIGS. 1A through 1C may be omitted in the interest of brevity.

Referring to FIG. 2, a length of the first semiconductor chip 210 and a length of the second semiconductor chip 220 may be greater than a length of the plurality of third semiconductor chips 300 in the x-axis direction and the y-axis direction of the plurality of third semiconductor chips 300. In addition, although the horizontal width of the first semiconductor chip 210 and the horizontal width of the second semiconductor chip 220 are illustrated as being the same as each other, this illustration is an example and is not limited thereto.

Thus, the horizontal width of the first semiconductor chip 210 and the horizontal width of the second semiconductor chip 220 may be different from each other. However, even when the horizontal width of the first semiconductor chip 210 and the horizontal width of the second semiconductor chip 220 are different from each other, the horizontal width of each semiconductor chip 200 may be greater than the horizontal width of the plurality of third semiconductor chips 300.

When the horizontal width of the first semiconductor chip 210 and the horizontal width of the second semiconductor chip 220 are the same as each other, the side surface of the first semiconductor chip 210 may be planar or substantially planar with the side surface of the second semiconductor chip 220.

FIGS. 3A through 3E are views showing various changes of the semiconductor package 10 according to embodiments of the inventive concept. In FIGS. 3A through 3E, the same reference numerals as in FIGS. 1A through 2 indicate substantially the same members, and a description made with reference to FIGS. 1A through 2 may be omitted in the interest of brevity.

Figure 3A:
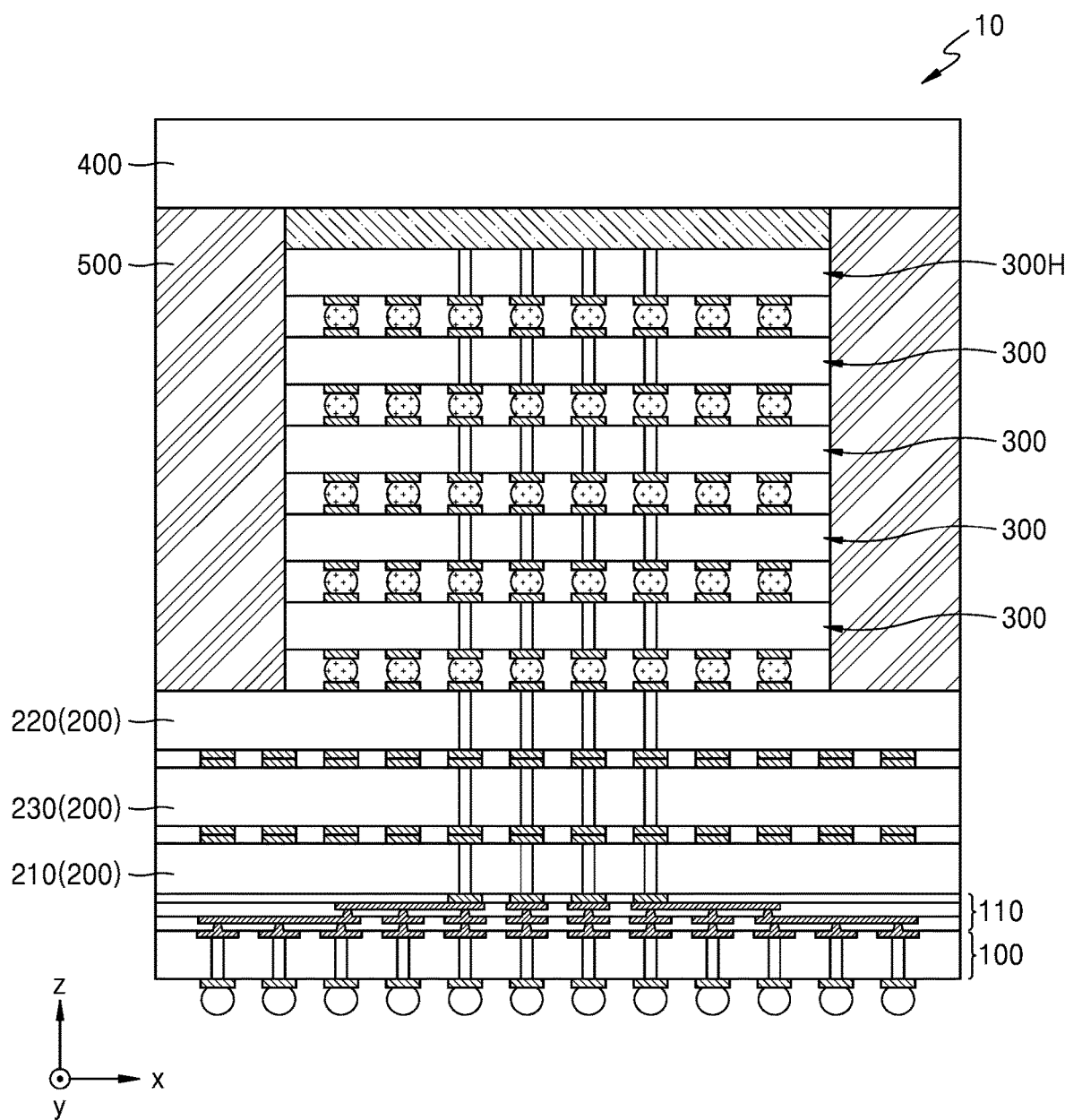
FIGS. 3A through 3E are cross-sectional views showing various changes of a semiconductor package according to embodiments of the inventive concept.

Referring to FIG. 3A, the semiconductor package 10 having a dummy chip 230 disposed between the first semiconductor chip 210 and the second semiconductor chip 220 is shown. However, this position of the dummy chip 230 may be an example, and the dummy chip 230 may be disposed between the second semiconductor chip 220 and the plurality of third semiconductor chips 300 and/or between the first semiconductor chip 210 and the interposer 100. In addition, a plurality of dummy chips 230 may be disposed in one semiconductor package 10.

The dummy chip 230 may include a semiconductor material. For example, the dummy chip 230 may include Si. Alternatively, the dummy chip 230 may include a semiconductor element such as Ge, or a compound semiconductor such as SiC, GaAs, InAs, and InP. For example, the dummy chip 230 may include the same material as the first substrate.

In some embodiments, each of the dummy chip 230 and the heat dissipation structure 400 may be formed by cutting a bare wafer and reducing a thickness. For example, each of the dummy chip 230 and the heat dissipation structure 400 may include a semiconductor material, for example, Si, except for a natural oxide film, etc. For example, the dummy chip 230 may not include a semiconductor device.

The dummy chip 230 may include through electrodes. In addition, the first semiconductor chip 210 and the dummy chip 230, and the dummy chip 230 and the second semiconductor chip 220 may be connected to each other through Cu-to-Cu direct bonding, oxide bonding, and/or direct contact of the bonding pad. For example, a distance between the first semiconductor chip 210 and the dummy chip 230 and a distance between the dummy chip 230 and the second semiconductor chip 220 may be about 1 µm to about 5 µm. For example, the distance between the first semiconductor chip 210 and the dummy chip 230 and the distance between the dummy chip 230 and the second semiconductor chip 220 may be about 2 µm to about 3 µm.

In addition, the length, thickness, horizontal width, and area of the dummy chip 230 may be the same as the length, thickness, horizontal width, and area of the first semiconductor chip 210, respectively.

Thus, the dummy chip 230 may act as a heat spreader that dissipates heat of the semiconductor package 10, and as a result, when the dummy chip 230 is disposed in the semiconductor package 10, the heat dissipation performance of the semiconductor package 10 may be further improved.

Figure 3B:
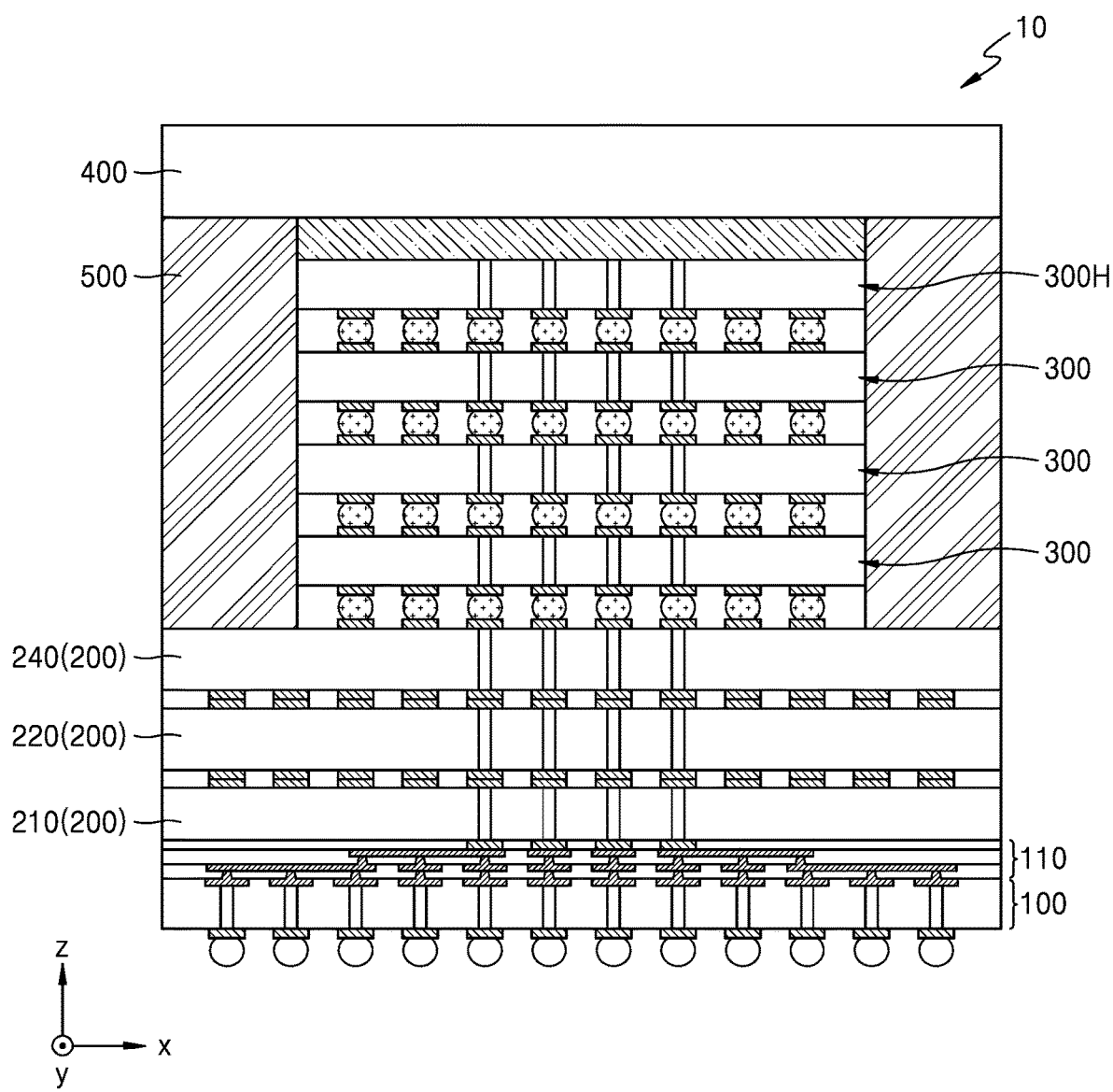

Referring to FIG. 3B, the semiconductor package 10 is shown where a fourth semiconductor chip 240 is disposed between the second semiconductor chip 220 and the plurality of third semiconductor chips 300. The fourth semiconductor chip 240 may also be a memory chip.

The fourth semiconductor chip 240 may include through electrodes. In addition, the second semiconductor chip 220 and the fourth semiconductor chip 240, and the fourth semiconductor chip 240 and each of the lowermost third semiconductor chips 300 among the plurality of third semiconductor chips 300 may be connected to each other through Cu-to-Cu direct bonding, oxide bonding, and/or direct contact of the bonding pad.

For example, the distance between the second semiconductor chip 220 and the fourth semiconductor chip 240 and the distance between the fourth semiconductor chip 240 and each of the lowermost third semiconductor chips 300 among the plurality of third semiconductor chips 300 may be about 1 µm to about 5 µm. For example, the distance between the second semiconductor chip 220 and the fourth semiconductor chip 240 and the distance between the fourth semiconductor chip 240 and each of the lowermost third semiconductor chips 300 among the plurality of third semiconductor chips 300 may be about 2 µm to about 3 µm.

In addition, the length, thickness, horizontal width, and area of the fourth semiconductor chip 240 may be the same as the length, thickness, horizontal width, and area of the first semiconductor chip 210, respectively.

Thus, the fourth semiconductor chip 240 may act as a heat spreader that dissipates heat of the semiconductor package 10, and as a result, when the fourth semiconductor chip 240 is disposed under the third semiconductor chips 300, the heat dissipation performance of the semiconductor package 10 may be improved.

Figure 3C:
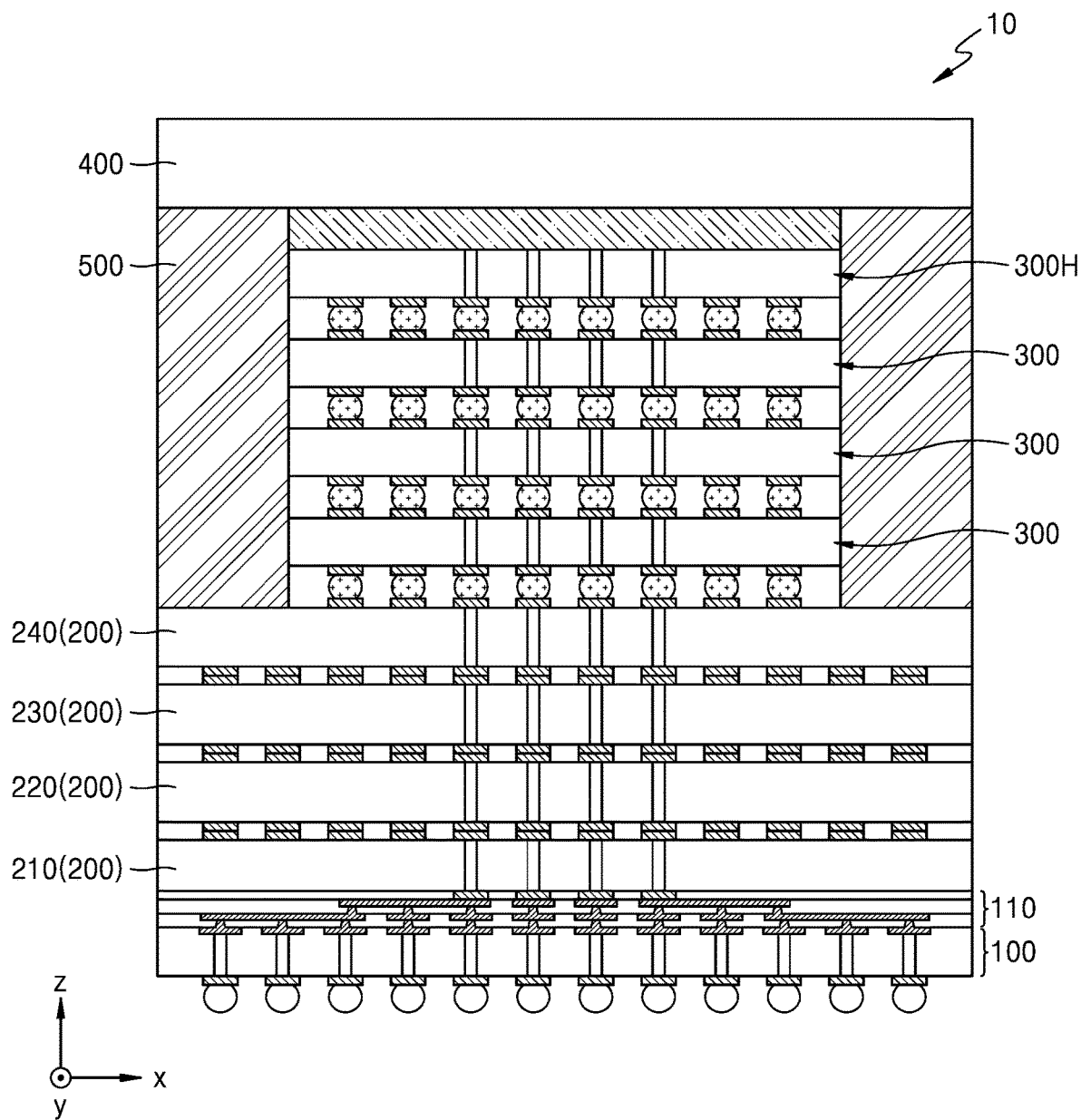

Referring to FIG. 3C, the semiconductor package 10 is shown where the dummy chip 230 is disposed between the second semiconductor chip 220 and the fourth semiconductor chip 240 and the fourth semiconductor chip 240 is disposed between the dummy chip 230 and the plurality of third semiconductor chips 300. A description made with reference to FIGS. 1A through 3B may be omitted in the interest of brevity. The arrangement positions of the dummy chip 230 and the fourth semiconductor chip 240 may vary. For example, the dummy chip 230 may be disposed between the first semiconductor chip 210 and the second semiconductor chip 220.

Thus, the dummy chip 230 and the first through fourth semiconductor chips 210, 220, and 240 act as heat spreaders that dissipate the heat of the semiconductor package 10, and as a result, the heat dissipation performance of the semiconductor package 10 may be improved when the dummy chip 230 and the fourth semiconductor chip 240 are disposed in the semiconductor package 10.

Figure 3D:
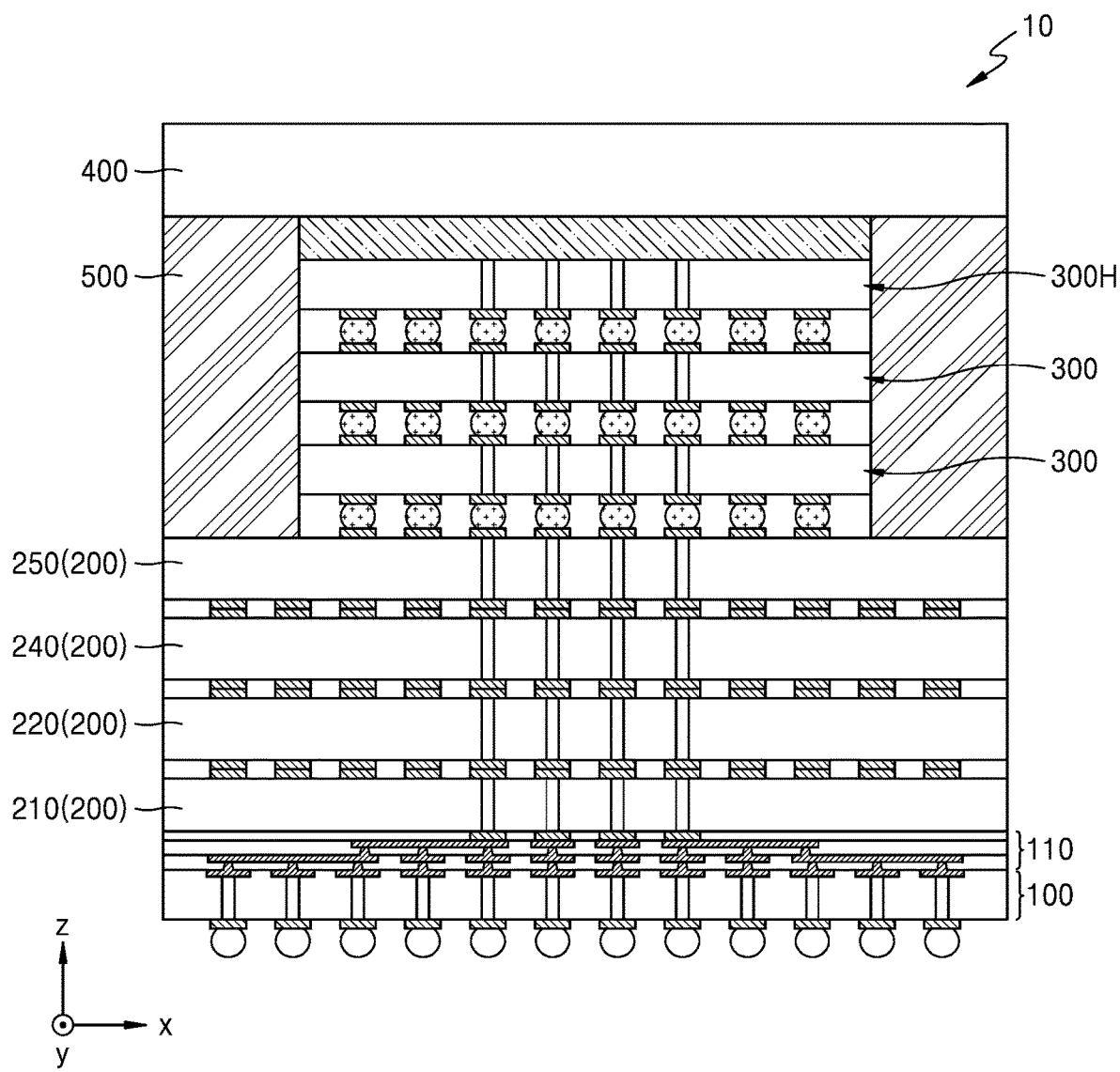

Referring to FIG. 3D, the semiconductor package 10 is shown where a fifth semiconductor chip 250 is disposed between the fourth semiconductor chip 240 and the plurality of third semiconductor chips 300. The fifth semiconductor chip 250 may also be a memory chip.

The fifth semiconductor chip 250 may include through electrodes. In addition, the fourth semiconductor chip 240 and the fifth semiconductor chip 250, and the fifth semiconductor chip 250 and each of the lowermost third semiconductor chips 300 among the plurality of third semiconductor chips 300 may be connected to each other through Cu-to-Cu direct bonding, oxide bonding, and/or direct contact of the bonding pad.

For example, the distance between the fourth semiconductor chip 240 and the fifth semiconductor chip 250 and the distance between the fifth semiconductor chip 250 and each of the lowermost third semiconductor chips 300 among the plurality of third semiconductor chips 300 may be about 1 μm to about 5 μm. For example, the distance between the fourth semiconductor chip 240 and the fifth semiconductor chip 250 and the distance between the fifth semiconductor chip 250 and each of the lowermost third semiconductor chips 300 among the plurality of third semiconductor chips 300 may be about 2 μm to about 3 μm.

In addition, the length, thickness, horizontal width, and area of the fifth semiconductor chip 250 may be the same as the length, thickness, horizontal width, and area of the first semiconductor chip 210, respectively. The fourth semiconductor chip 240 and/or the fifth semiconductor chip 250 may be included in the plurality of semiconductor chips 200.

Thus, the first through fifth semiconductor chips 210, 220, 240, and 250 act as heat spreaders that dissipate the heat of the semiconductor package 10, and as a result, the heat dissipation performance of the semiconductor package 10 may be improved when the fourth semiconductor chip 240 and the fifth semiconductor chip 250 are disposed in the semiconductor package 10.

Each of the fourth semiconductor chip 240 and the fifth semiconductor chip 250 may include a fourth substrate and a fifth substrate on active surfaces of which a fourth semiconductor device and a fifth semiconductor device are formed, and a plurality of fourth front connection pads and a plurality of fifth front connection pads disposed on the active surface of the fourth substrate and the fifth substrate, respectively. The fourth and fifth substrates are generally similar to the first through third substrates, and thus, a detailed description thereof is omitted here in the interest of brevity.

Figure 3E:
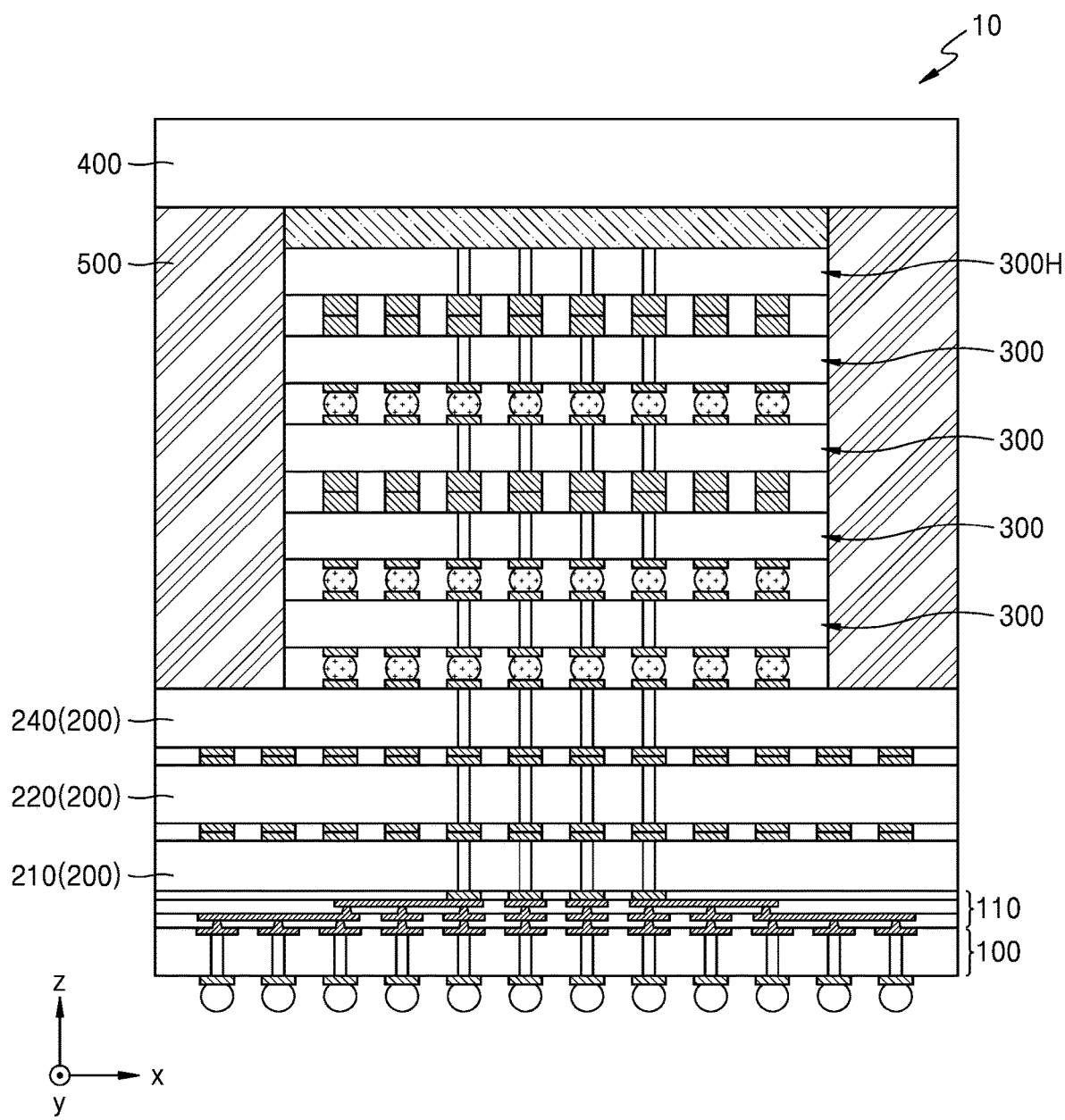

Referring to FIG. 3E, the semiconductor package 10 is shown in which a connection scheme of each of the plurality of third semiconductor chips 300 is combined. As described above, each of the plurality of third semiconductor chips 300 may be connected to each other through Cu-to-Cu direct bonding, oxide bonding, and/or direct contact of the bonding pad.

Although two direct connection methods and a connection method including three conductive bumps are shown as an example in the drawings, this is merely an example and the inventive concept is not limited thereto.

When the plurality of third semiconductor chips 300 are directly connected, a distance of each of the plurality of semiconductor chips 200 may be reduced in comparison to when the plurality of semiconductor chips 200 are connected to each other by including a conductive bump. For example, the distance between adjacent ones of the plurality of third semiconductor chips 300 may be about 5 μm to about 15 μm.

FIG. 4 is a cross-sectional view of a semiconductor package 1000 according to an embodiment of the inventive concept.

Referring to FIG. 4, the semiconductor package 1000 may include a package base substrate 700, the interposer 100 attached to or disposed on the package base substrate 700, the first semiconductor chip 210 attached to or disposed on the interposer 100, the second semiconductor chip 220 disposed on the first semiconductor chip 210, the plurality of third semiconductor chips 300 disposed on the second semiconductor chip 220, and a logic semiconductor chip 600 attached to or disposed on the interposer 100.

The interposer 100 may include an interposer redistribution layer, at least one redistribution insulation layer, and/or a plurality of redistribution patterns similar to the interposer 100 shown in FIG. 1B, and thus, a detailed description thereof is omitted here in the interest of brevity. To the interposer 100, stacked structures may be attached which has the logic semiconductor chip 600 therebetween and spaced apart from the logic semiconductor chip 600 in a horizontal direction. The stacked structure may be referred to as a memory stack. For example, the semiconductor package 1000 may include a plurality of stacked structures. In the drawings, as an example, it is shown that two stacked structures are included on one package base substrate 700. However, this is exemplary and the number of stacked structures disposed on one package base substrate 700 may be changed variously.

The logic semiconductor chip 600 may include a sixth substrate having a sixth semiconductor device formed on an active surface thereof, and a plurality of sixth front connection pads disposed on the active surface of the sixth substrate. The sixth substrate may be substantially similar to the first to fifth substrates, and thus, a detailed description thereof is omitted here in the interest of brevity. The plurality of sixth front connection pads of the logic semiconductor chip 600 may be electrically connected in contact with some redistribution top pads disposed on the top surface of the interposer redistribution layer among the plurality of redistribution line patterns of the interposer redistribution layer.

The semiconductor chips 200 may include the logic semiconductor chip 600 and/or the memory semiconductor chip. For example, the logic semiconductor chip 600 may be an application processor (AP), a microprocessor, a central processing unit (CPU), a controller, a graphics processor unit (GPU), an application specific integrated circuit (ASIC), etc.

The package base substrate 700 may include a base board layer 710, and a plurality of first top surface pads 722 and a plurality of first bottom surface pads 724 respectively disposed on a top surface and a bottom surface of the base board layer 710. The package base substrate 700 may include a plurality of first interconnection paths electrically connecting the plurality of first top surface pads 722 to the plurality of first bottom surface pads 724 through the base board layer 710. In some embodiments, the package base substrate 700 may be a PCB. For example, the package base substrate 700 may be a multi-layer PCB.

It is shown in the drawing as an example that the molding layer 500 of the inventive concept is disposed on the top surface of the second semiconductor chip 220 and not disposed outside a memory stack. However, this is merely an example, and the molding layer 500 may cover the top surface of the interposer 100. That is, the molding layer 500 may fill an empty space between the memory stack and the logic semiconductor chip 600.

Although the semiconductor package 1000 according to the inventive concept is shown as having a 2.5-dimensional stacked structure, as an example, an embodiment of the inventive concept is not limited thereto.

The semiconductor package 1000 may be a lower semiconductor package or an upper semiconductor package constituting a semiconductor package of a package on package (PoP) type.

The semiconductor package 1000 may be a three-dimensional (3D) structure semiconductor package. The 3D structure semiconductor package may reduce the distance between the semiconductor chips 200 by vertically stacking several semiconductor chips 200 that are the same as or different from each other. The semiconductor chips 200 may have respective through electrodes, thereby shortening a time taken for data transmission to other semiconductor chips 200. The 3D structure semiconductor package may include various types of semiconductor chips 200 freely arranged therein, thereby increasing a speed of data processing between the semiconductor chips 200.

In another embodiment, the semiconductor package 1000 may be a wafer level package (WLP) and may be a fan-out wafer level package (FOWLP) or a fan-in wafer level package (FIWLP) where a package connection terminal or an external connection pad is outside a region of the semiconductor chip 200 or inside the region of the semiconductor chip 200.

For example, the semiconductor package 1000 may be a chip last fan out semiconductor package in which after the interposer 100 or the semiconductor substrate is formed, at least one semiconductor chip 200 is mounted on the interposer 100 or the semiconductor substrate. In another embodiment, the semiconductor package 1000 may be a chip-first package structure where at least one semiconductor chip 200 is mounted on a tape, the periphery of the semiconductor chip 200 is surrounded with a molding layer, and the interposer 100 or the semiconductor substrate is connected to the semiconductor chip 200. In some embodiments, the semiconductor package 1000 may be a fan-out panel level package (FOPLP).

For example, the semiconductor package 1000 may include the plurality of semiconductor chips 200, and the semiconductor package 1000 may be a system-in-package (SIP) in which a plurality of semiconductor chips 200 of different types are electrically connected to each other to operate as a single system.

While the inventive concept has been particularly shown and described with reference to embodiments thereof, it will be understood that various changes in form and details may be made therein without departing from the scope of the following claims.

What is claimed is:

1. A semiconductor package comprising:
a first semiconductor chip;
a second semiconductor chip stacked on the first semiconductor chip; and
a plurality of third semiconductor chips sequentially stacked on the second semiconductor chip,
wherein a horizontal width of each of the first semiconductor chip and the second semiconductor chip is greater than a horizontal width of each of the plurality of third semiconductor chips,
the first semiconductor chip and the second semiconductor chip are connected to each other through direct contact of a bonding pad, and
a distance between adjacent ones of the plurality of third semiconductor chips is greater than a distance between the first semiconductor chip and the second semiconductor chip.

2. The semiconductor package of claim 1, wherein a thickness of each of the first semiconductor chip and the second semiconductor chip is greater than a thickness of each of the plurality of third semiconductor chips.

3. The semiconductor package of claim 1, wherein a ratio of a thickness of each of the first semiconductor chip and the second semiconductor chip to a thickness of each of the plurality of third semiconductor chips is about 135% to about 195%.

4. The semiconductor package of claim 1, wherein a thickness of the first semiconductor chip and a thickness of the second semiconductor chip are equal to each other.

5. The semiconductor package of claim 1, wherein a thickness of each of the first semiconductor chip and the second semiconductor chip is about 65 μm to about 95 μm.

6. The semiconductor package of claim 1, wherein a distance between the first semiconductor chip and the second semiconductor chip is about 1 μm to about 5 μm.

7. The semiconductor package of claim 1, wherein at least some chip connection terminals of the second semiconductor chip are disposed in a region in which the second semiconductor chip does not vertically overlap or align with the plurality of the third semiconductor chips.

8. The semiconductor package of claim 1, wherein a ratio of a horizontal width of each of the first semiconductor chip and the second semiconductor chip to a horizontal width of each of the plurality of the third semiconductor chips is about 110% to about 140%.

9. The semiconductor package of claim 1, wherein side surfaces of the first semiconductor chip and the second semiconductor chip are substantially coplanar with each other.

10. The semiconductor package of claim 1, further comprising a molding layer surrounding the plurality of third semiconductor chips.

11. The semiconductor package of claim 10, wherein side surfaces of the first semiconductor chip, the second semiconductor chip, and the molding layer are substantially coplanar with each other.

12. A semiconductor package comprising:
a first semiconductor chip;
a second semiconductor chip stacked on the first semiconductor chip; and
a plurality of third semiconductor chips sequentially stacked on the second semiconductor chip,
wherein a horizontal width of each of the first semiconductor chip and the second semiconductor chip is greater than a horizontal width of each of the plurality of third semiconductor chips,
the first semiconductor chip and the second semiconductor chip are connected to each other through direct contact of a bonding pad, and
a ratio of a thickness of each of the first semiconductor chip and the second semiconductor chip to a thickness of each of the plurality of third semiconductor chips is about 135% to about 195%.

13. The semiconductor package of claim 12, wherein a thickness of each of the first semiconductor chip and the second semiconductor chip is about 65 μm to about 95 μm.

14. The semiconductor package of claim 12, wherein a distance between the first semiconductor chip and the second semiconductor chip is about 1 μm to about 5 μm.

15. The semiconductor package of claim 12, wherein at least some chip connection terminals of the second semiconductor chip are disposed in a region in which the second semiconductor chip does not vertically overlap or align with the plurality of the third semiconductor chips.

16. The semiconductor package of claim 12, wherein a ratio of a horizontal width of each of the first semiconductor chip and the second semiconductor chip to a horizontal width of each of the plurality of the third semiconductor chips is about 110% to about 140%.

17. A semiconductor package comprising:
a first semiconductor chip;
a second semiconductor chip stacked on the first semiconductor chip; and
a plurality of third semiconductor chips sequentially stacked on the second semiconductor chip,
wherein a horizontal width of each of the first semiconductor chip and the second semiconductor chip is greater than a horizontal width of each of the plurality of third semiconductor chips,
the first semiconductor chip and the second semiconductor chip are connected to each other through direct contact of a bonding pad, and
a ratio of a horizontal width of each of the first semiconductor chip and the second semiconductor chip to a horizontal width of each of the plurality of the third semiconductor chips is about 110% to about 140%.

18. The semiconductor package of claim 17, wherein a thickness of each of the first semiconductor chip and the second semiconductor chip is about 65 μm to about 95 μm.

19. The semiconductor package of claim 17, wherein a distance between the first semiconductor chip and the second semiconductor chip is about 1 μm to about 5 μm.

20. The semiconductor package of claim 17, wherein at least some chip connection terminals of the second semiconductor chip are disposed in a region in which the second semiconductor chip does not vertically overlap or align with the plurality of the third semiconductor chips.

* * * * *